(12) United States Patent
Sun

(10) Patent No.: US 9,786,506 B2
(45) Date of Patent: Oct. 10, 2017

(54) ARRAY SUBSTRATE, MANUFACTURING METHOD THEREFOR AND DISPLAY DEVICE

(71) Applicant: BOE TECHNOLOGY GROUP CO., LTD., Beijing (CN)

(72) Inventor: Bing Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 13 days.

(21) Appl. No.: 14/125,648

(22) PCT Filed: Nov. 15, 2012

(86) PCT No.: PCT/CN2012/084701
§ 371 (c)(1),
(2) Date: Dec. 12, 2013

(87) PCT Pub. No.: WO2013/139135
PCT Pub. Date: Sep. 26, 2013

(65) Prior Publication Data
US 2014/0110719 A1  Apr. 24, 2014

(30) Foreign Application Priority Data
Mar. 23, 2012  (CN) .......................... 2012 1 0080924

(51) Int. Cl.
*H01L 21/28* (2006.01)
*H01L 29/423* (2006.01)
(Continued)

(52) U.S. Cl.
CPC ...... *H01L 21/28008* (2013.01); *H01L 27/124* (2013.01); *H01L 29/42356* (2013.01); *H01L 29/42384* (2013.01); *H01L 29/4908* (2013.01)

(58) Field of Classification Search
CPC ............ H01L 21/28008; H01L 27/124; H01L 29/42356; H01L 29/42384; H01L 29/4908
(Continued)

(56) References Cited

U.S. PATENT DOCUMENTS 5,296,653 A * 3/1994 Kiyota .............. G02F 1/136286
174/250
5,467,882 A * 11/1995 Ahn .................................. 216/23
(Continued)

FOREIGN PATENT DOCUMENTS

CN  1726600 A  1/2006
CN  101017881 A  8/2007
(Continued)

OTHER PUBLICATIONS

Office Action Rejection Decision (Chinese language) issued on Jun. 4, 2014 by the State Intellectual Property Office ("SIPO") for application 201210080924.8, nine (9) pages.
(Continued)

*Primary Examiner* — Michael Jung
*Assistant Examiner* — Charles R Peters
(74) *Attorney, Agent, or Firm* — Ladas & Parry LLP

(57) ABSTRACT

Provided is a manufacturing method for an array substrate, which relates to the technical field of displaying and comprises the steps of: S1: forming a pattern which comprises a first gate electrode (2) on a substrate (1); S2: forming a second gate electrode (4) above the first gate electrode (2) on the substrate (1) after step S1, and conducting oxidation treatment on the surface of the second gate electrode (4) to form a gate-insulating layer, the first gate electrode (2) and the second gate electrode (4) forming a gate electrode together; and S3: forming a layer-level structure of a pattern which comprises an active layer, source and drain electrodes, a data line, a passivation layer and a pixel electrode
(Continued)

on the substrate after step S2. Also provided are an array substrate and a display device.

11 Claims, 1 Drawing Sheet

(51) Int. Cl.
   *H01L 29/49* (2006.01)
   *H01L 27/12* (2006.01)

(58) Field of Classification Search
   USPC ............................. 438/22–30, 34, 149
   See application file for complete search history.

(56) References Cited

U.S. PATENT DOCUMENTS

| | | | |
|---|---|---|---|
| 2007/0181871 A1 | 8/2007 | Song et al. | |
| 2007/0236641 A1 | 10/2007 | Ning et al. | |
| 2008/0017862 A1* | 1/2008 | Lee et al. | 257/59 |
| 2008/0241990 A1* | 10/2008 | Kim et al. | 438/99 |
| 2010/0200859 A1 | 8/2010 | Joo et al. | |
| 2014/0110719 A1 | 4/2014 | Sun | |

FOREIGN PATENT DOCUMENTS

| | | |
|---|---|---|
| CN | 101051644 A | 10/2007 |
| CN | 101131936 A | 2/2008 |
| CN | 102629592 A | 8/2012 |

OTHER PUBLICATIONS

English translation of Office Action Rejection Decision, listed above, 10 pages.
PCT International Preliminary Report on Patentability issued Sep. 23, 2014 by the International Searching Authority ("ISA"), 7 pages.
First Office Action issued by the Chinese Patent Office for Chinese Patent Application No. 201210080924.8 dated Jul. 24, 2013, 6pgs.
English translation of First Office Action issued by the Chinese Patent Office for Chinese Patent Application No. 201210080924.8 dated Jul. 24, 2013, 5pgs.
Second Office Action issued by the Chinese Patent Office for Chinese Patent Application No. 2012100809248 dated Feb. 26, 2014, 8pgs.
English translation of Second Office Action issued by the Chinese Patent Office for Chinese Patent Application No. 2012100809248 dated Feb. 26, 2014, 8pgs.
International Search Report for International Application No. PCT/CN2012/084701, 11pgs.
English translation of Chinese Patent No. 1726600, 19pgs.
English translation of Chinese Patent No. 101051644, 29pgs.
English translation of Chinese Patent No. 101017881, 29pgs.
English translation of Chinese Patent No. 101131936, 16pgs.
English translation of Chinese Patent No. 102629592, 16pgs.

* cited by examiner

ARRAY SUBSTRATE, MANUFACTURING METHOD THEREFOR AND DISPLAY DEVICE

CROSS REFERENCE TO RELATED APPLICATIONS

This application is based on International Application No. PCT/CN2012/084701 filed on Nov. 15, 2012, which claims priority to Chinese National Application No. 201210080924.8 filed on Mar. 23, 2012, the contents of which are incorporated herein by reference.

TECHNICAL FIELD

Embodiments of the present invention relate to an array substrate and a manufacturing thereof, and a display device.

BACKGROUND

In the conventional methods for manufacturing an array substrate, a gate electrode, a common electrode line and a gate insulating layer are manufactured by depositing the materials for the gate electrode and the gate insulating layer, respectively. The gate electrode and the common electrode line are generally made of a same material and formed in a same layer. In the conventional methods, the gate electrode and the gate insulating layer are made of different materials. This manufacturing process is relatively complicated and leads to higher costs.

SUMMARY

Embodiments of the present invention form the gate insulating layer by simpler process so as to save the manufacturing costs for an array substrate.

One aspect of the present invention provides a method of manufacturing an array substrate, comprising the following steps:

S1: forming on a substrate a pattern comprising a first gate electrode;

S2: forming a second gate electrode over the first gate electrode on the substrate after step S1, and performing an oxidization treatment on a surface of the second gate electrode so as to form a gate insulating layer, wherein the first gate electrode and the second gate electrode together form a gate electrode; and S3: forming a layered structure comprising patterns of an active layer, source/drain electrodes, and a data line, a passivation layer, and a pixel electrode on the substrate after step S2.

In the manufacturing method, for example, the step S1 may further comprise: along with manufacturing the first gate electrode, forming a pattern of a first common electrode line on the substrate.

The step S2 may further comprise: along with manufacturing the second gate electrode, forming a second common electrode line on the first common electrode line on the substrate after step S1, and performing an oxidization treatment on a surface of the second common electrode line so as to form a gate insulating layer, wherein the first common electrode line and the second common electrode line together form a common electrode line.

In the manufacturing method, for example, the material for the second gate electrode and the second common electrode line may be metal copper.

In the manufacturing method, for example, the metal for forming the pattern of the first gate electrode and the first common electrode line in the step S1 may include Ta, Cr, Mo, Ti or alloys thereof.

In the manufacturing method, for example, the step S2 may comprise:

S2.1: depositing a metal thin film on the substrate after step S1;

S2.2: forming, by a patterning process, a metal electrode pattern covering the pattern of the first gate electrode;

S2.3: oxidizing the metal electrode surface into a metal oxide layer by an oxidization process, wherein the oxidized metal oxide forms the gate insulating layer pattern, and the metal electrode that is not oxidized forms the pattern of the second gate electrode.

In the manufacturing method, for example, in the step S2.2, the metal electrode pattern also covers the first common electrode line; in the step S2.3, the metal electrode that is not oxidized further forms the pattern of the second common electrode line.

In the manufacturing method, for example, the metal thin film has a thickness of 2000 Å~6000 Å.

In the manufacturing method, for example, the metal electrode surface is oxidized into the metal oxide by thermal oxidation or plasma oxidation in the step S2.3.

Another aspect of the present invention provides an array substrate, which comprises a gate electrode on a substrate and a gate insulating layer covering the gate electrode, the gate electrode comprising a first gate electrode and a second gate electrode covering the first gate electrode, the gate insulating layer being a metal oxide insulating layer obtained by oxidizing a metal surface of the second gate electrode.

For example, the array substrate may comprise a common electrode line on the substrate and a gate insulating layer covering the common electrode line; the common electrode line comprising a first common electrode line and a second common electrode line covering the first common electrode line, and the gate insulating layer over the second common electrode line being a metal oxide insulating layer obtained by oxidizing a metal surface of the second common electrode line.

In the array substrate, a material for the second gate electrode and the second common electrode line may be metal copper.

A further aspect of the present invention provides a display device, which comprises the aforementioned array substrate.

The manufacturing method for the array substrate in an embodiment of the present invention oxidizes the surface of the second gate electrode such that the surface of the second gate electrode forms a gate insulating layer using the oxide as the material and the second gate electrode that is not oxidized and the first gate electrode at the lower layer together form a gate electrode. Therefore, there is no need to use additional gate insulating layer material, thus achieving the advantageous effect of saving materials of gate insulating layer and solving the technical problem of higher process costs of TFT-LCD.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative to the invention.

DETAILED DESCRIPTION

Figure 1:
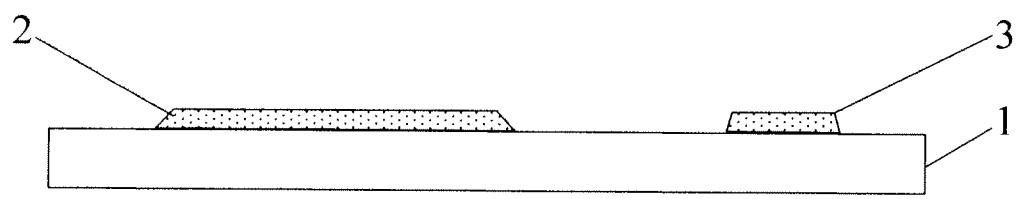
FIG. 1 is a structural schematic view of a first gate electrode and a first common electrode line formed on a glass substrate in an embodiment of the present invention.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, the technical or scientific terms used herein shall have the general meanings understandable for those ordinarily skilled in the field of the present invention. The words such as "the first", "second" or similar used in the description and claims of the present application shall not represent any order, number or importance, but are used for distinguishing between similar elements. The expressions such as "a", "an" or the like shall not represent limitation of numbers, but mean existence of at least one. The phrases such as "joint", "connect" or the like are not limited to physical or chemical connection, but also include electrical connection, no matter directly or indirectly. The phrases "upper", "lower", "left", "right" and etc. are used only to represent relative positions; where the absolute position of the described object is changed, the relative positions shall be changed accordingly.

The array substrate in an embodiment of the present invention comprises a plurality of gate lines and a plurality of data lines, the gate lines and the data lines intersecting each other to define pixel units arranged in a matrix, each of the pixel units comprising a thin film transistor as a switching element and a pixel electrode for controlling alignment of liquid crystal. For example, a gate electrode of the thin film transistor in each pixel is electrically connected to or integrally formed with a corresponding gate line, a source electrode thereof is electrically connected to or integrally formed with a corresponding data line, and a drain electrode thereof is electrically connected to or integrally formed with a corresponding pixel electrode. The following description is mainly about one or more pixel units, but other pixel units may be formed similarly.

In each pixel unit, besides liquid crystal capacitance generated by the pixel electrode and the opposed electrode (formed on an array substrate or an opposed substrate opposite to the array substrate), storage capacitance may be further provided to improve the capability of the liquid crystal capacitance to maintain charges and to improve the display effect.

In general, there are two ways of realizing storage capacitance: one is to form a common electrode line on a substrate and to form storage capacitance between the common electrode line and a pixel electrode (Cst on Common); the other is to form storage capacitance between a gate line and a pixel electrode (Cst on Gate), in which case there is no need to separately dispose a common electrode line.

In the following embodiment, the method of manufacturing the array substrate of the present invention is described by taking the array substrate of Cst on Common for example.

The process of manufacturing the array substrate in the embodiment is described in detail as follows.

As shown in FIG. 1, a pattern comprising a first gate electrode 2 and a first common electrode line 3 is formed on a glass substrate 1. The step may be implemented in a traditional process. At the same time, a gate line (not shown) is also formed, and the gate line is connected to or integrally formed with the gate electrode.

The glass substrate 1 as the base may be replaced by a substrate made of such a transparent material as quartz. A thin film of Ta, Cr, Mo, Ti or an alloy thereof with a thickness of 100 Å~2000 Å is deposited on the glass substrate 1 by sputtering or heat evaporation. The thin film is coated with photoresist and is formed into the first gate electrode 2 and the first common electrode line 3 as shown in FIG. 1 after steps of exposing, developing, and etching. The first gate electrode 2 and the first common electrode line 3 are firstly formed to prevent the metal (Cu) and the glass substrate (having $SiO_2$ as the main composition) from diffusing to each other during the subsequent high-temperature process, and thus to prevent the resistance of the metal (Cu) from increasing; furthermore, the poor adhesion between the metal (Cu) and the glass will lead to phenomenon of peeling.

Figure 2:
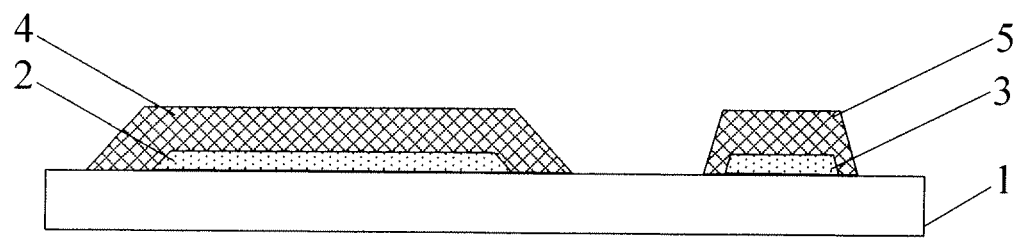
FIG. 2 is a structural schematic view after the metal (Cu) electrode is formed on the basis of the substrate of FIG. 1.
Figure 3:
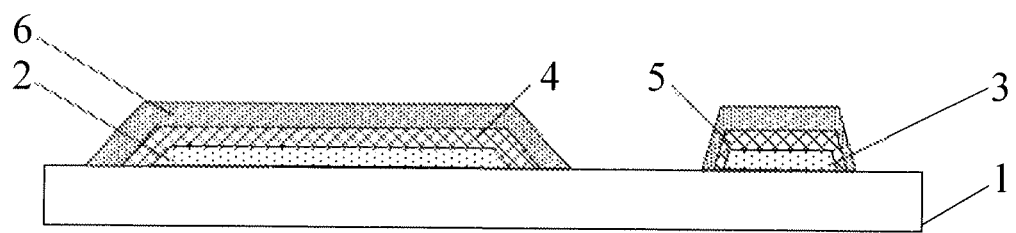
FIG. 3 is a structural schematic view after the gate electrode, the common electrode line and the gate insulating layer are formed on the basis of the substrate of FIG. 2.

As shown in FIGS. 2 and 3, a second gate electrode, a second common electrode line, and a pattern of an insulating layer covering the second gate electrode and the second common electrode are formed on the substrate after S1. The detailed formation is as follows.

A metal thin film is deposited on the glass substrate 1 after S1 by sputtering or heat evaporation. Copper is used in this embodiment, and the thickness of the film may be 2000 Å~6000 Å.

Patterns of a copper electrode 4 and a copper electrode 5 covering the first gate electrode 2 and the first common electrode line 3 are formed by a series of patterning process such as exposing, developing, etching and removing, as shown in FIG. 2. For example, the copper thin film is coated with a layer of photoresist, the photoresist is exposed and developed using a mask plate, the photoresist on the first gate electrode 2 and the first common electrode line 3 remains to form a photoresist pattern, and the exposed copper is etched away using the photoresist pattern as an etching mask, so as to form patterns of a copper electrode 4 and a copper electrode 5 respectively covering the first gate electrode 2 and the first common electrode line 3.

For example, the surfaces of the copper electrodes 4 and 5 are oxidized by thermal oxidization or plasma oxidization process to form copper oxide, CuOx. As shown in FIG. 3, the oxide CuOx is to form a pattern of a gate insulating layer 6, and the copper electrodes 4 and 5 that are not oxidized form patterns of the second gate electrode and the second common electrode line. The first gate electrode 2 and the second gate electrode (copper electrode 4) together form a gate electrode, and the first common electrode line 3 and the second common electrode line (copper electrode 5) together form a common electrode line.

A layered structure comprising patterns of an active layer, source/drain electrodes, a data line, a passivation layer, and a pixel electrode is formed on the substrate after the aforementioned steps. The pixel electrode and the common electrode line are partially overlapped so as to form a storage capacitor. The step may also be implemented by a traditional process, for example, described as follows.

After the above steps are completed, a semiconductor layer having a thickness of, for example, 1000 Å~3000 Å and an ohmic contact layer having a thickness of 500 Å~1000 Å are consecutively deposited on the substrate using plasma enhanced chemical vapor deposition (PECVD) method. The reaction gas corresponding to the semiconductor layer may be $SiH_4$ and $H_2$ or $SiH_2Cl_2$ and $H_2$. The reaction gas corresponding to the ohmic contact layer may be $SiH_4$, $PH_3$, and $H_2$ or $SiH_2Cl_2$, $PH_3$, and $H_2$. A buffer layer having a thickness of 500 Å~10000 Å may be formed of Mo, Ta, Ti, Ni, MoTi, MoNb or alloys thereof by sputtering or heat evaporation. A dual-tone (half-tone or grey-tone) mask plate is used for exposure and development, thus to form a semiconductor layer patter, a TFT channel, a source electrode, a drain electrode and a data scanning line after multiple steps of etching.

Then, a passivation layer having a thickness of about 700 Å~5000 Å is deposited on the substrate after the aforementioned steps using the PECVD method to cover the above structure and a via hole is formed in the passivation layer. The passivation layer may be selected from oxide, nitride, or oxynitride, and the corresponding reaction gas may be $SiH_4$, $NH_3$, and $N_2$ or $SiH_2Cl_2$, $NH_3$, and $N_2$.

Next, a transparent conductive layer having a thickness of about 300 Å~600 Å is deposited on the substrate, for example, by sputtering or heat evaporation. The transparent conductive layer may be ITO or IZO, or other metals and metal oxides. A transparent pixel electrode is formed by one photolithographic process.

By using the aforementioned manufacturing method, the gate electrode of the array substrate provided by the embodiment of the present invention comprises a first gate electrode and a second electrode covering the first electrode; the common electrode line thereof comprises a first common electrode line and a second common electrode line covering the first common electrode line; the gate insulating layer is a metal oxide covering the second gate electrode and the second common electrode line. Preferably, the material for the second gate electrode and the second common electrode line is metal copper, and the copper oxide CuOx is formed after oxidation as the gate insulating layer.

Due to the employed special method for manufacturing the gate electrode, the common electrode line and the gate insulating layer, the manufacturing method of the aforementioned array substrate saves process flow and costs compared with the traditional manufacturing process.

In the above embodiment, the manufacturing process of the gate line is not clearly described. But, it is definitely known to those skilled in the art that the gate line can be integrally formed with the gate electrode of TFT. Therefore, manufacturing of the gate line adopting the above solution also belongs to the protection scope of the present invention. In addition, the gate line, for example, extends parallel to the common electrode line.

The above embodiments are introduced by taking example of the array substrate of Cst on Common, and the array substrate of Cst on Gate may be formed in another embodiment, i.e. forming a storage capacitance between the gate line and the pixel electrode, while no common electrode line (i.e. the first common electrode line and the second common electrode line) is formed.

The aforementioned embodiment provides a method by only taking the manufacturing process of the Twisted Nematic (TN) array substrate for example. Besides, the solution provided in the embodiments of the present invention can be applied to the manufacturing of In-Plane Switching (IPS) array substrate, Fringe Field Switching (FFS) array substrate, etc.

The present invention further provides a display device comprising any of the above described array substrate. The display device may be a liquid crystal panel, E-paper, organic light emitting diode (OLED) panel, a liquid crystal television, a liquid crystal display, a digital photoframe, a mobile phone, a flat panel computer and other products or members having display function.

The above embodiments of the present invention are given by way of illustration only and thus are not limitative of the protection scope of the present invention, which is determined by the attached claims.

The invention claimed is:

1. A method of manufacturing an array substrate, comprising the following steps:
    S1: forming a pattern comprising a first gate electrode and a first common electrode line directly on a substrate; and
    S2: after step 1, forming a second gate electrode of Cu over the first gate electrode and forming a second common electrode line over the first common electrode line simultaneously on the substrate, and performing an oxidization treatment on a surface of the second gate electrode and of the second common electrode line so as to form a gate insulating layer of copper oxide (CuOx);
    wherein the first gate electrode and the second gate electrode together form a gate electrode, and the first common electrode line and the second common electrode line together form a common electrode line;
    wherein the first gate electrode is completely surrounded by the second gate electrode and the substrate, and the first common electrode line is completely surrounded by the second common electrode line and the substrate,
    S3: forming a layered structure comprising patterns of an active layer, source/drain electrodes, and a data line, a passivation layer, and a pixel electrode on the substrate after step S2.

2. The method of manufacturing an array substrate according to claim 1, wherein the step S2 comprises:
    S2.1: depositing a metal thin film on the substrate after step S1:
    S2.2: forming a metal electrode pattern covering the pattern of the first gate electrode by a patterning process; and
    S2.3: oxidizing the metal electrode surface into a metal oxide layer by an oxidization process, wherein the oxidized metal oxide forms the gate insulating layer pattern, and the metal electrode that is not oxidized forms the pattern of the second gate electrode.

3. The method of manufacturing an array substrate according to claim 1, wherein the step S2.2 further comprises: the metal electrode pattern further covering the first common electrode line; and
    the step S2.3 further comprises: the metal electrode that is not oxidized further forming the pattern of the second common electrode line.

4. The method of manufacturing an array substrate according to claim 3, wherein the material for the second gate electrode and the second common electrode line is metal copper.

5. The method of manufacturing an array substrate according to claim 1, wherein the metal for forming the pattern of the first gate electrode and the first common electrode line in the step S1 includes Ta, Cr, Mo, Ti or alloys thereof.

6. The method of manufacturing an array substrate according to claim 1, wherein the metal thin film has a thickness of 2000 Å~6000 Å.

7. The method of manufacturing an array substrate according to claim 1, wherein the metal electrode surface is oxidized into the metal oxide by thermal oxidation or plasma oxidation in the step S2.3.

8. The method of manufacturing an array substrate according to claim 1, wherein the gate insulating layer covers the second gate electrode and the second common electrode line.

9. An array substrate, comprising a gate electrode and a first common electrode line on a substrate, a second gate electrode covering the first gate electrode, and a second common electrode line covering the first common electrode line; and a gate insulating layer covering the second gate electrode and the second common electrode line, wherein the first gate electrode is completely surrounded by the second gate electrode and the substrate, and wherein the first common electrode line is completely surrounded by the second common electrode line and the substrate, wherein the second gate electrode is of Cu, and the gate insulating layer is of copper oxide (CuOx), wherein the gate insulating layer is obtained by oxidizing a surface of the second gate electrode and of the second common electrode line, and wherein a layered structure is formed comprising patterns of an active layer, source/drain electrodes, and a data line, a passivation layer, and a pixel electrode on the substrate.

10. The array substrate according to claim 9, wherein a material for the second common electrode line is metal copper.

11. A display device, which comprises the array substrate according to claim 9.

* * * * *